(12) United States Patent
Horn et al.

(10) Patent No.: US 9,054,291 B2
(45) Date of Patent: Jun. 9, 2015

(54) COMPRESSION VOLUME COMPENSATION

(75) Inventors: David Horn, Saratoga, CA (US); Brian Cumpston, Pleasanton, CA (US); David Titzler, Palo Alto, CA (US)

(73) Assignee: Switch Bulb Company, Inc., San Jose, CA (US)

( * ) Notice: Subject to any disclaimer, the term of this patent is extended or adjusted under 35 U.S.C. 154(b) by 0 days.

(21) Appl. No.: 13/525,227

(22) Filed: Jun. 15, 2012

(65) Prior Publication Data
US 2013/0146901 A1 Jun. 13, 2013

Related U.S. Application Data

(60) Provisional application No. 61/547,595, filed on Oct. 14, 2011.

(51) Int. Cl.
| H01L 33/64 | (2010.01) |
| H01L 33/00 | (2010.01) |
| F21K 99/00 | (2010.01) |
| F21Y 101/02 | (2006.01) |

(52) U.S. Cl.
CPC .............. *H01L 33/648* (2013.01); *H01L 33/64* (2013.01); *H01L 33/005* (2013.01); *F21K 9/135* (2013.01); *F21Y 2101/02* (2013.01); *F21V 29/506* (2015.01); *F21V 29/58* (2015.01); *F21V 29/77* (2015.01)

(58) Field of Classification Search
CPC ..... H01L 33/64; H01L 33/644; H01L 33/648; H01L 2924/12041; F21V 29/02; F21V 29/30; F21V 29/40; F21V 29/402

USPC ................................................ 313/45, 46, 47
See application file for complete search history.

(56) References Cited

U.S. PATENT DOCUMENTS

| 4,601,038 | A | 7/1986 | Guch, Jr. |
| 6,340,449 | B1 * | 1/2002 | Gallus ........................... 422/307 |
| 2003/0175457 | A1 * | 9/2003 | Jousse et al. .................. 428/36.7 |
| 2005/0024875 | A1 * | 2/2005 | Zhang ........................... 362/264 |
| 2010/0060130 | A1 | 3/2010 | Li |
| 2010/0170670 | A1 | 7/2010 | Catalano |
| 2011/0193479 | A1 | 8/2011 | Nilssen et al. |
| 2011/0228516 | A1 * | 9/2011 | Stewart et al. .................. 362/84 |

OTHER PUBLICATIONS

International Search Report and Written Opinion received for PCT Patent Application No. PCT/US2012/060127, mailed on Jan. 25, 2013, 7 pages.
International Preliminary Report on Patentability received for PCT Patent Application No. PCT/US2012/060127, mailed on Apr. 24, 2014, 6 pages.

* cited by examiner

*Primary Examiner* — Thao X Le
*Assistant Examiner* — Geoffrey Ida
(74) *Attorney, Agent, or Firm* — Morrison & Foerster LLP

(57) ABSTRACT

A liquid-filled light emitting diode (LED) bulb including a base, a shell, one or more LEDs, a thermally conductive liquid, and a bladder. The shell is connected to the base and the thermally conductive liquid is held within the shell. The one or more LEDs are disposed within the shell and immersed in the thermally conductive liquid. The bladder is also immersed in the thermally conductive liquid and is configured to compensate for expansion of the thermally conductive liquid.

28 Claims, 9 Drawing Sheets

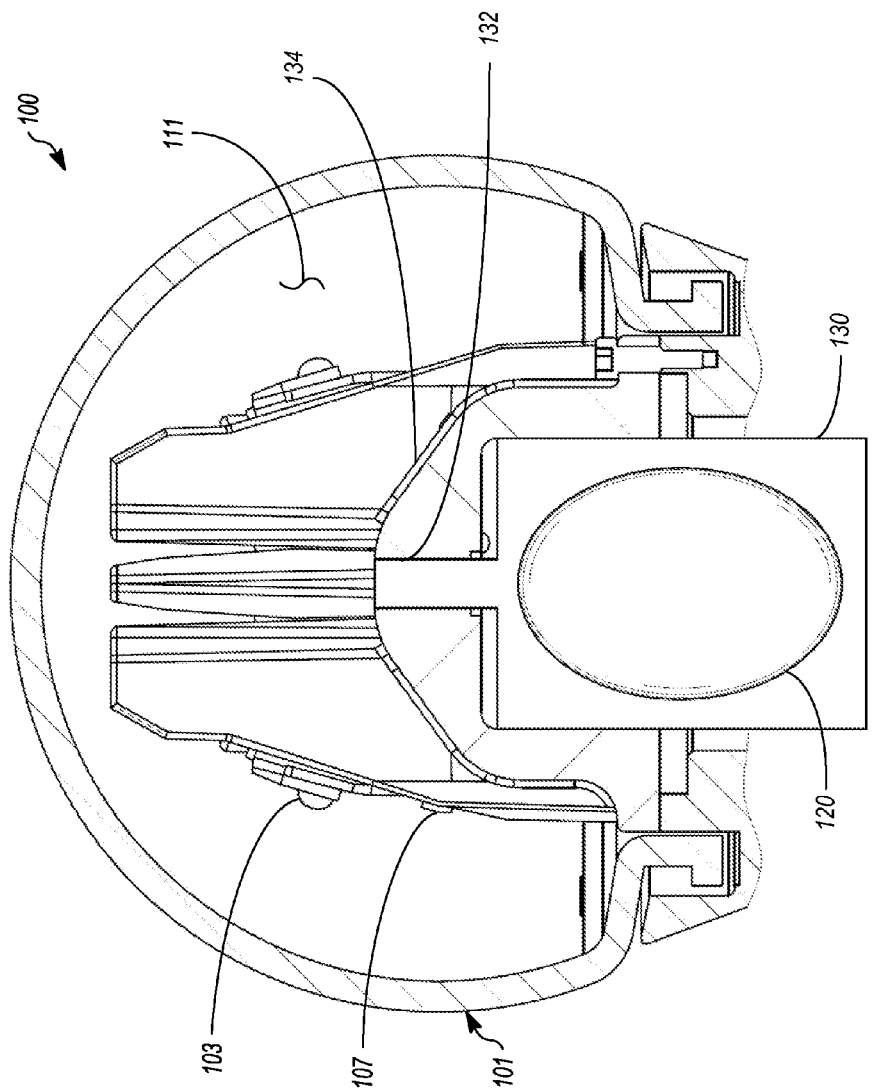

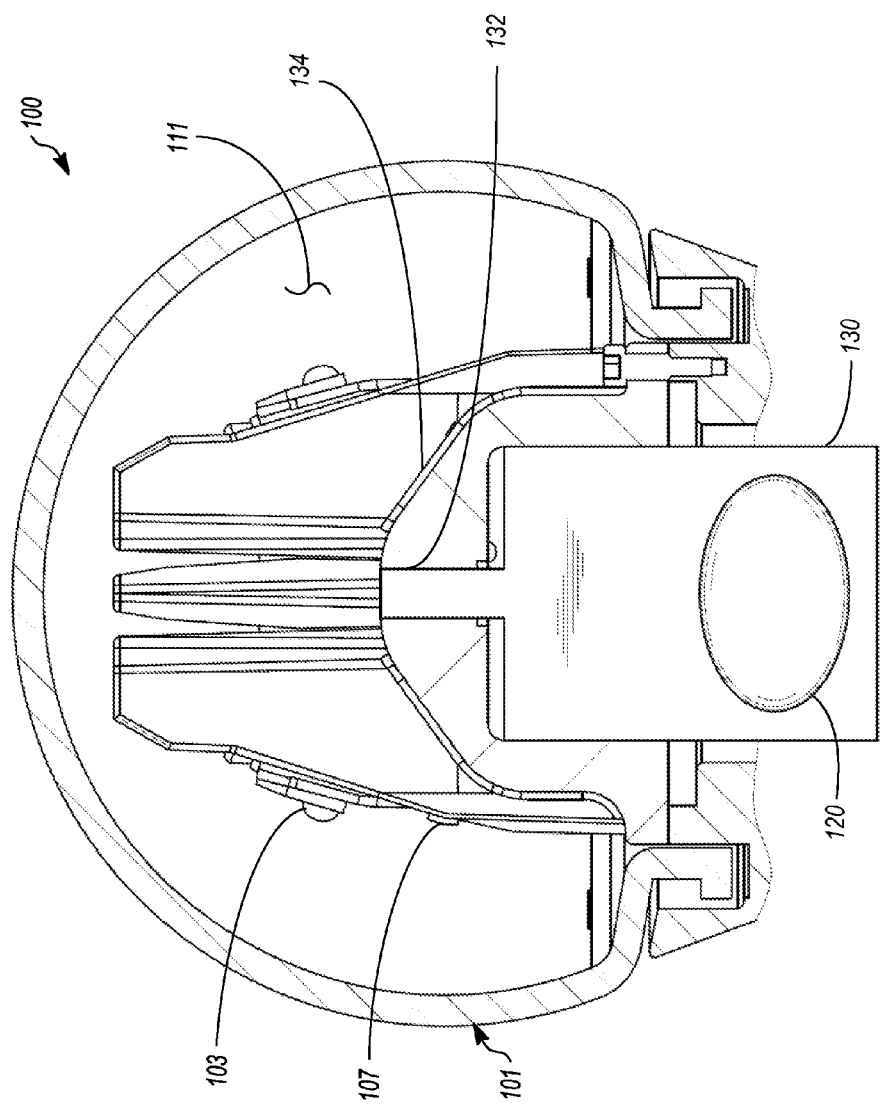

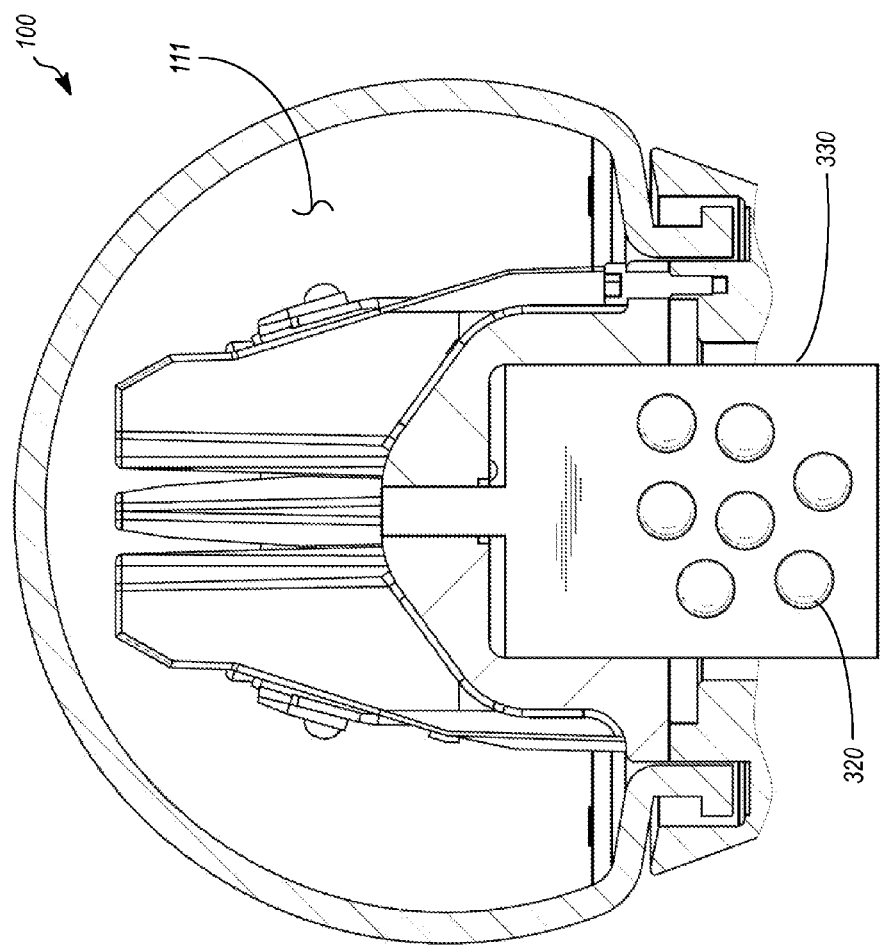

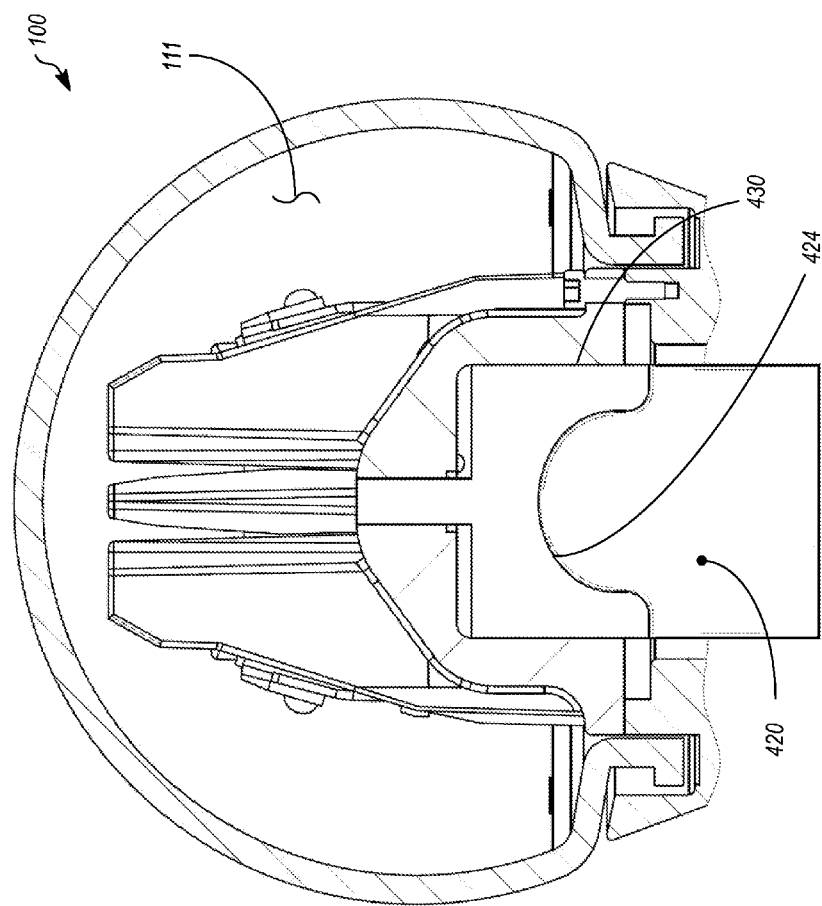

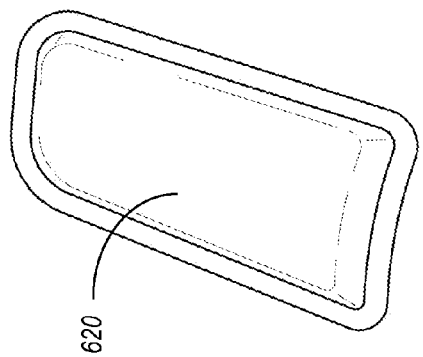
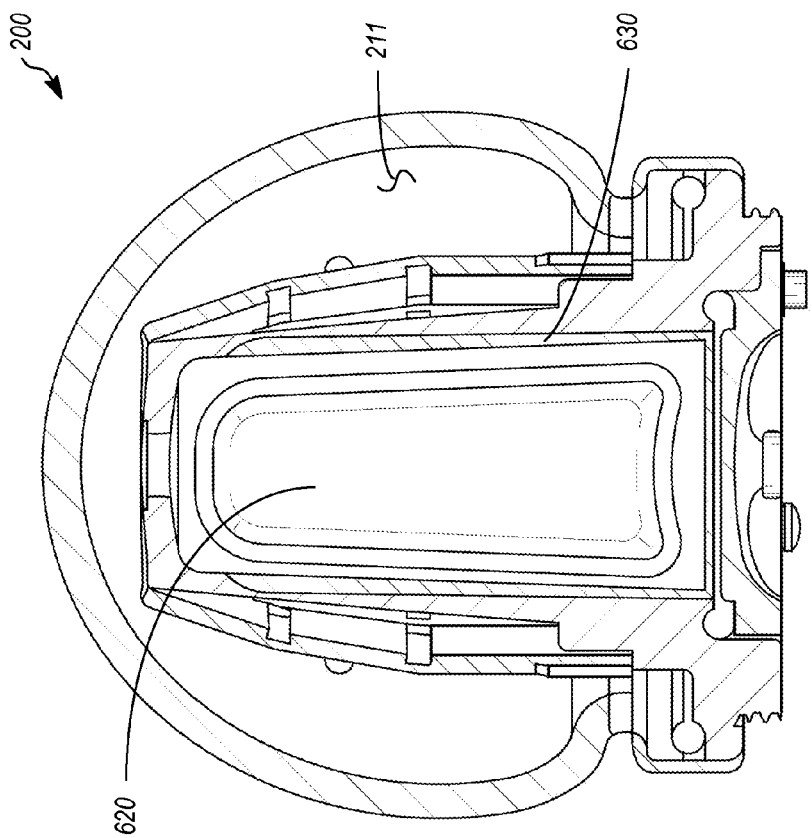

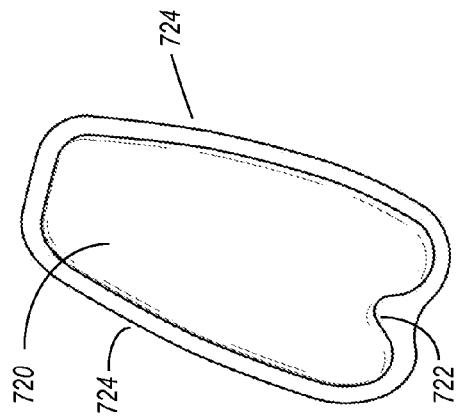
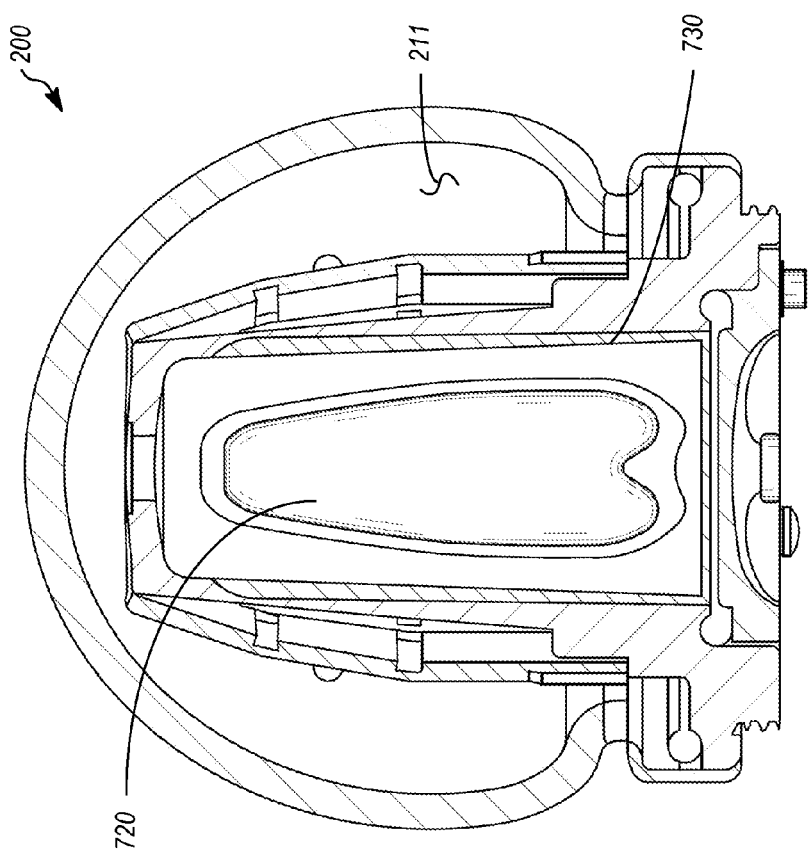
FIG. 7B
FIG. 7A

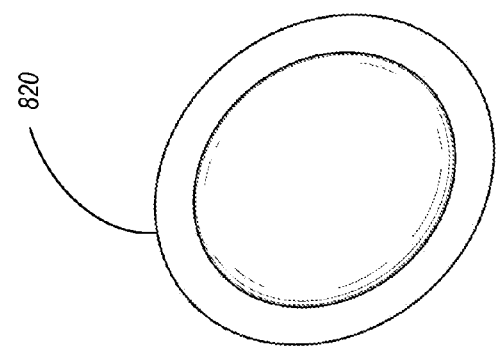
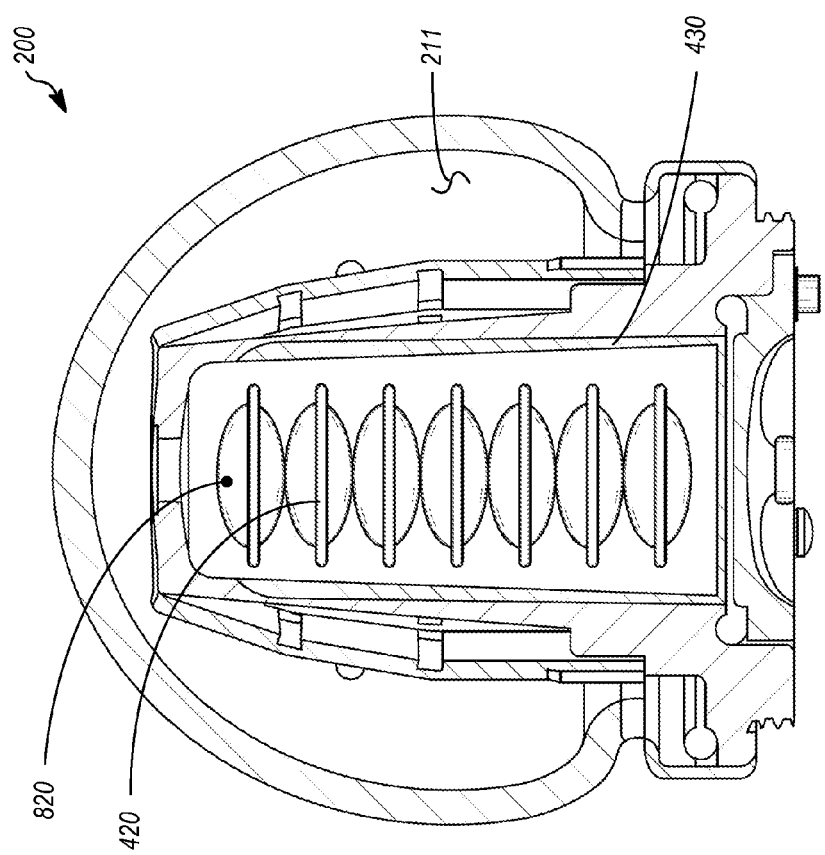

COMPRESSION VOLUME COMPENSATION

CROSS REFERENCE TO RELATED APPLICATIONS

This application claims the benefit under 35 USC 119(e) of prior U.S. Provisional Patent Application No. 61/547,595, filed Oct. 14, 2011, the disclosure of which is hereby incorporated by reference in its entirety.

BACKGROUND

1. Field

The present disclosure relates generally to liquid-filled light emitting diode (LED) bulbs and, more specifically, to providing a mechanism to allow for thermal expansion of a thermally conductive liquid in an LED bulb.

2. Related Art

Traditionally, lighting has been generated using fluorescent and incandescent light bulbs. While both types of light bulbs have been reliably used, each suffers from certain drawbacks. For instance, incandescent bulbs tend to be inefficient, using only 2-3% of their power to produce light, while the remaining 97-98% of their power is lost as heat. Fluorescent bulbs, while more efficient than incandescent bulbs, do not produce the same warm light as that generated by incandescent bulbs. Additionally, there are health and environmental concerns regarding the mercury contained in fluorescent bulbs.

Thus, an alternative light source is desired. One such alternative is a bulb utilizing an LED. An LED comprises a semiconductor junction that emits light due to an electrical current flowing through the junction. Compared to a traditional incandescent bulb, an LED bulb is capable of producing more light using the same amount of power. Additionally, the operational life of an LED bulb is orders of magnitude longer than that of an incandescent bulb, for example, 10,000-100,000 hours as opposed to 1,000-2,000 hours.

While there are many advantages to using an LED bulb rather than an incandescent or fluorescent bulb, LEDs have a number of drawbacks that have prevented them from being as widely adopted as incandescent and fluorescent replacements. One drawback is that an LED, being a semiconductor, generally cannot be allowed to get hotter than approximately 150° C. As an example, A-type LED bulbs have been limited to very low power (i.e., less than approximately 8 W), producing insufficient illumination for incandescent or fluorescent replacements.

One potential solution to this problem is to use a large metallic heat sink attached to the LEDs and extending away from the bulb. However, this solution is undesirable because of the common perception that customers will not use a bulb that is shaped radically different from the traditionally shaped A-type form factor bulb. Additionally, the heat sink may make it difficult for the LED bulb to fit into pre-existing fixtures.

Another solution is to fill the bulb with a thermally conductive liquid to transfer heat from the LED to the shell of the bulb. The heat may then be transferred from the shell out into the air surrounding the bulb. As heat is transferred from the LED to the conductive liquid, the temperature of the liquid increases, resulting in an increase in the liquid volume due to thermal expansion. Some liquid-filled LED bulbs use a pocket of air or bubble in the bulb. As the temperature of the liquid increases, the volume of the liquid expands, and the pocket of air or bubble is compressed.

However, it is undesirable to have a pocket of air or bubble in the liquid-filled bulb. First, a pocket of air reduces the cooling efficiency of the bulb by creating an air barrier between the liquid and at least a portion of the outer shell housing. Second, the bubble may distort the light created by the LED, resulting in a non-uniform light distribution. The bubble may create a bright reflection or darkened area detracting from the visual appeal of the bulb. Third, an air bubble draws attention to the fact that the bulb is filled with a liquid, which may not be appealing to customers.

SUMMARY

In one exemplary embodiment, an LED bulb has a base, a shell connected to the base, one or more LEDs, a thermally conductive liquid, and a bladder. The thermally conductive liquid is held within the shell. The one or more LEDs are disposed within the shell and immersed in the thermally conductive liquid. The bladder is configured to compensate for expansion of the thermally conductive liquid.

DESCRIPTION OF THE FIGURES

FIGS. 2A and 2B depict a cross-sectional view of an LED bulb with a bladder.
FIG. 3 depicts a cross-sectional view of an LED bulb with multiple bladders.
FIG. 4 depicts a cross-sectional view of an LED bulb with a bladder formed using a diaphragm.
FIG. 6A depicts a cross-sectional view of an LED bulb with a bladder.
FIG. 6B depicts an exemplary bladder.
FIG. 7A depicts a cross-sectional view of an LED bulb with a bladder having an alternative profile shape.
FIG. 7B depicts an exemplary bladder.
FIG. 8A depicts a cross-sectional view of an LED bulb with multiple bladders.
FIG. 8B depicts an exemplary bladder.

DETAILED DESCRIPTION

The following description is presented to enable a person of ordinary skill in the art to make and use the various embodiments. Descriptions of specific devices, techniques, and applications are provided only as examples. Various modifications to the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

Various embodiments are described below, relating to LED bulbs. As used herein, an "LED bulb" refers to any light-generating device (e.g., a lamp) in which at least one LED is used to generate the light. Thus, as used herein, an "LED bulb" does not include a light-generating device in which a filament is used to generate the light, such as a conventional incandescent light bulb. It should be recognized that the LED bulb may have various shapes in addition to the bulb-like A-type shape of a conventional incandescent light bulb. For example, the bulb may have a tubular shape, globe shape, or the like. The LED bulb of the present disclosure may further include any type of connector; for example, a screw-in base, a dual-prong connector, a standard two- or three-prong wall outlet plug, bayonet base, Edison Screw base, single-pin base, multiple-pin base, recessed base, flanged base, grooved base, side base, or the like.

As used herein, the term "liquid" refers to a substance capable of flowing. Also, the substance used as the thermally conductive liquid is a liquid or at the liquid state within, at least, the operating ambient temperature range of the bulb. An exemplary temperature range includes temperatures between −40° C. to +40° C. Also, as used herein, "passive convective flow" refers to the circulation of a liquid without the aid of a fan or other mechanical devices driving the flow of the thermally conductive liquid.

Figure 1:
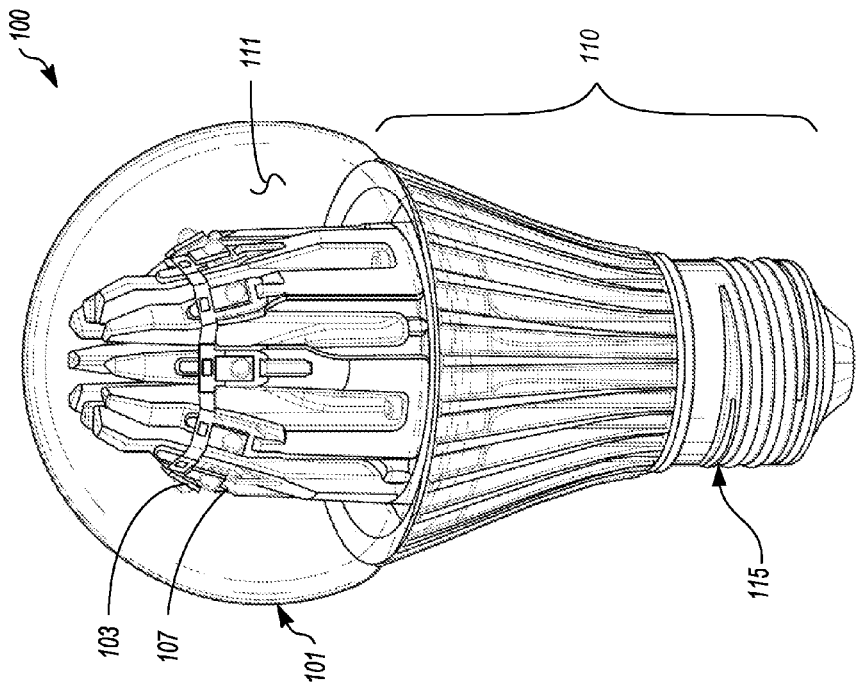
FIG. 1 depicts an LED bulb.

FIG. 1 depicts an exemplary liquid-filled LED bulb 100. LED bulb 100 includes a base 110 and a shell 101 encasing the various components of LED bulb 100. The shell 101 is attached to the base 110 forming an enclosed volume. An array of LEDs 103 are mounted to LED mounts 107 and are disposed within the enclosed volume. The enclosed volume is filled with a thermally conductive liquid 111.

For convenience, all examples provided in the present disclosure describe and show LED bulb 100 being a standard A-type form factor bulb. However, as mentioned above, it should be appreciated that the present disclosure may be applied to LED bulbs having any shape, such as a tubular bulb, globe-shaped bulb, or the like.

Shell 101 may be made from any transparent or translucent material such as plastic, glass, polycarbonate, or the like. Shell 101 may include dispersion material spread throughout the shell to disperse light generated by LEDs 103. The dispersion material prevents LED bulb 100 from appearing to have one or more point sources of light.

As noted above, light bulbs typically conform to a standard form factor, which allows bulb interchangeability between different lighting fixtures and appliances. Accordingly, in the present exemplary embodiment, LED bulb 100 includes connector base 115 for connecting the bulb to a lighting fixture. In one example, connector base 115 may be a conventional light bulb base having threads for insertion into a conventional light socket. However, as noted above, it should be appreciated that connector base 115 may be any type of connector for mounting LED bulb 100 or coupling to a power source. For example, connector base may provide mounting via a screw-in base, a dual-prong connector, a standard two- or three-prong wall outlet plug, bayonet base, Edison Screw base, single-pin base, multiple-pin base, recessed base, flanged base, grooved base, side base, or the like.

In some embodiments, LED bulb 100 may use 6 W or more of electrical power to produce light equivalent to a 40 W incandescent bulb. In some embodiments, LED bulb 100 may use 20 W or more to produce light equivalent to or greater than a 75 W incandescent bulb. Depending on the efficiency of the LED bulb 100, between 4 W and 16 W of heat energy may be produced when the LED bulb 100 is illuminated.

The LED bulb 100 includes several components for dissipating the heat generated by LEDs 103. For example, as shown in FIG. 1, LED bulb 100 includes one or more LED mounts 107 for holding LEDs 103. LED mounts 107 may be made of any thermally conductive material, such as aluminum, copper, brass, magnesium, zinc, or the like. Since LED mounts 107 are formed of a thermally conductive material, heat generated by LEDs 103 may be conductively transferred to LED mounts 107. Thus, LED mounts 107 may act as a heat-sink or heat-spreader for LEDs 103.

LED mounts 107 are attached to bulb base 110 allowing the heat generated by LEDs 103 to be conducted to other portions of LED bulb 100. LED mounts 107 and bulb base 110 may be formed as one piece or multiple pieces. The bulb base 110 may also be made of a thermally conductive material and attached to LED mount 107 to conduct heat generated by LED 103 into the bulb base 110. Bulb base 110 is also attached to shell 101. Bulb base 110 can also thermally conduct with shell 101.

Bulb base 110 also includes one or more components that provide the structural features for mounting bulb shell 101 and LED mount 107. Components of the bulb base 110 include, for example, sealing gaskets, flanges, rings, adaptors, or the like. As mentioned above, bulb base 110 also includes a connector base 115 for connecting the bulb to a power source or lighting fixture. Bulb base 110 can also include one or more die-cast parts.

LED bulb 100 is filled with thermally conductive liquid 111 for transferring heat generated by LEDs 103 to shell 101. The thermally conductive liquid 111 fills the enclosed volume defined between shell 101 and bulb base 110, allowing the thermally conductive liquid 111 to thermally conduct with both the shell 101 and the bulb base 110. The LEDs 103 are immersed in the thermally conductive liquid 111. As shown in FIG. 1, at least a portion of the thermally conductive liquid 111 is disposed between the LEDs 103 and the shell 101.

Thermally conductive liquid 111 may be any thermally conductive liquid, mineral oil, silicone oil, glycols (PAGs), fluorocarbons, or other material capable of flowing. It may be desirable to have the liquid chosen be a non-corrosive dielectric. A non-corrosive dielectric liquid may reduce the possibility of electrical shorts and protect electrical components of LED bulb 100 from damage.

LED bulb 100 includes a receptacle to allow for thermal expansion of thermally conductive liquid 111 contained in the LED bulb 100. In the present exemplary embodiment, the receptacle is a bladder 120 filled with a compressible medium (e.g., a gas, foam, compressible gel). In FIGS. 2A and 2B, the bladder 120 is disposed in a cavity 130 of the bulb base 110 and immersed in the thermally conductive liquid 111. The cavity 130 is in fluidic connection with the enclosed volume created between the shell 101 and base 110. As shown in FIGS. 2A and 2B, a channel 132 connects the enclosed volume and the cavity 130, allowing the thermally conductive liquid 111 to enter the cavity 130. The portion of the cavity that is not occupied by the bladder 120 is typically filled with the thermally conductive liquid 111.

In the exemplary embodiment depicted in FIGS. 2A and 2B, the bladder 120 is configured to allow for thermal expansion of the thermally conductive fluid. When the LEDs 103 are in operation, heat is produced and the temperature of the thermally conductive liquid 111 increases. As the temperature of the thermally conductive liquid 111 increases, the liquid expands, and the volume of the thermally conductive liquid 111 increases. As shown in FIGS. 2A and 2B, the bladder 120 is immersed in the thermally conductive liquid 111 and is able to contract to compensate for the increase in volume of the thermally conductive liquid 111.

As shown in FIGS. 2A and 2B, the bladder 120 is able to change between a first condition (depicted in FIG. 2A) and a second condition (depicted in FIG. 2B), in response to the expansion of the thermally conductive liquid 111. In one example, the first condition, shown in FIG. 2A, may represent the approximate shape of the bladder 120 when the thermally conductive liquid 111 is at a first temperature (e.g., when the LED bulb 100 is not in operation). The second condition, shown in FIG. 2B, may represent the approximate shape of the bladder 120 when the thermally conductive liquid 111 is at a second temperature (e.g., when the LED bulb 100 is in operation and has reached a steady-state temperature). In this example, the second temperature is higher than the first temperature.

As shown in FIGS. 2A and 2B, the bladder 120 displaces a first volume in the first condition and displaces a second volume in the second condition. The difference between the first volume and the second volume typically corresponds to the change in volume of the thermally conductive liquid 111 due to thermal expansion.

In general, the size of the bladder 102 may be selected to provide an expansion volume ($V_e$). The size of the expansion volume ($V_e$) depends on several parameters, including total liquid volume ($V_f$), at the lowest average fluid temperature ($T_a$), highest average bulb temperature ($T_b$), and coefficient of thermal expansion ($\alpha$). The minimum capacity of the expansion volume ($V_{e(min)}$) can be calculated as:

$$V_{e(min)} = V_f \times \alpha (T_b - T_a).$$ (Equation 1)

$V_f$ is the total liquid volume at the lowest average fluid temperature ($T_a$) that is approximately the volume of thermally conductive liquid 111 as installed in the LED bulb 100 during manufacturing. Exemplary ranges for $V_f$ at 25 degrees C. include a range of 15 to 90 ml and a preferred range of 40 to 60 ml. $\alpha$ is the coefficient of thermal expansion, which is a material property of the thermally conductive liquid 111. $\alpha$ can be selected to minimize or reduce the expansion volume ($V_e$). An exemplary range of $\alpha$ includes $1.4 \times 10^{-3}$ degrees $C^{-1}$ to $7.0 \times 10^{-4}$ degrees $C^{-1}$.

In Equation 1, $T_a$ and $T_b$ are based on estimated environmental conditions and maximum operating temperature of the LEDs 103. Using Equation 1 to calculate $V_e$ of the bladder 120, the lowest expected $T_a$ should be used. An exemplary range for $T_a$ includes –40 degrees C. to +40 degrees C. $T_b$ is the average, steady-state temperature of the thermally conductive liquid 111 when the LED bulb 100 is operating at full power. An exemplary $T_b$ is approximately 90 degrees C. Preferably, $T_b$ should be below 150 degrees C. The LED bulb 100 can reach steady-state temperature after 180 minutes of continuous operation.

In general, the bladder 120 provides an expansion volume $V_e$ that is at least as large as $V_{e(min)}$ calculated using Equation 1. An exemplary $V_e$ of the bladder 120 is at least 5 ml. Another exemplary $V_e$ of the bladder 120 is at least 7 ml.

In some embodiments, the compressible medium inside the bladder 120 provides a force that restores the shape of the bladder 120 when the internal pressure of the LED bulb 100 is reduced. For example, as explained above, the bladder 120 is capable of compressing in response to heating and thermal expansion of the thermally conductive liquid 111. When the LED bulb 100 is in operation, the bladder 120 may be compressed to the second condition. When the LED bulb 100 is not in operation and cools, the volume of the thermally conductive liquid 111 will reduce. The compressible medium inside the bladder 120 provides a force that acts on the inside surface of the bladder walls to help restore the shape of the bladder 120, as the thermally-conductive liquid 111 cools. This force helps the bladder 120 return to the first condition.

In some embodiments, the thermally conductive liquid 111 is always at a positive pressure with respect to the ambient air pressure in the operating environment (e.g., atmospheric pressure at sea level). For example, the thermally conductive liquid 111 may be at a positive pressure with respect to the ambient air pressure when the bladder 120 is in a first condition, as shown in FIG. 2A. The bladder 120 may help maintain the positive pressure of the thermally conductive liquid 111, even when the LED bulb is at the cold end of the expected environmental temperature range.

As shown in FIGS. 2A and 2B and mentioned above, the bladder 120 may be installed in a cavity 130. The cavity 130 is in fluidic connection with the enclosed volume via a channel 132 located at one end of the cavity 130. Using the channel 132, as shown in FIGS. 2A and 2B, has the advantage of reducing the amount of light absorbed by the bladder 120. For example, the channel 132 can be less than 5 mm but larger than 1 mm in diameter. To further reduce the light absorbed by the bladder 120, the opening of the channel 132 may be covered with a perforated plate or screen. The opening can also be covered with a reflective baffle.

As shown in FIGS. 2A and 2B, the LED bulb 100 may include a central portion of the base 134 where the opening of the channel 132 is located. The central portion of the base 134 is shaped to facilitate passive convective flow of thermally conductive liquid 111. For example, the shape of the central portion of the base 134 should minimize stagnant or dead zones in the passive convective flow of thermally conductive liquid 111. The central portion of the base 134 is tapered in a shallow cone shape to facilitate passive convective flow of thermally conductive liquid 111 when the LED bulb is inverted (e.g., positioned with the base 110 above the shell 101).

FIG. 3 depicts a cross-sectional view of an LED bulb 100 with multiple bladders 320 contained in chamber 330. The enclosed volume of the LED bulb 100 and the chamber 330 are filled with a thermally conductive liquid 111. Each of the multiple bladders 320 is able to compress to provide for some portion of the thermal expansion of the thermally conductive liquid 111. In some cases, each bladder 320 depicted in FIG. 3 is a small shell or bead filled with a compressible medium. FIGS. 8A and 8B, discussed in more detail below, depict another embodiment of an LED bulb having multiple bladders.

In some embodiments, the bladder can be formed, in part, using the walls of the chamber. For example, FIG. 4 depicts a cross-sectional view of an LED bulb 100 having a bladder 420 made from a diaphragm 424 attached to the walls of the chamber 430. In this embodiment, the bladder 420 is formed by the diaphragm 424 and a portion of the walls of the chamber 430. The volume within the bladder 420 is filled with a compressible medium and is effectively sealed from ambient air pressure.

Figure 5:
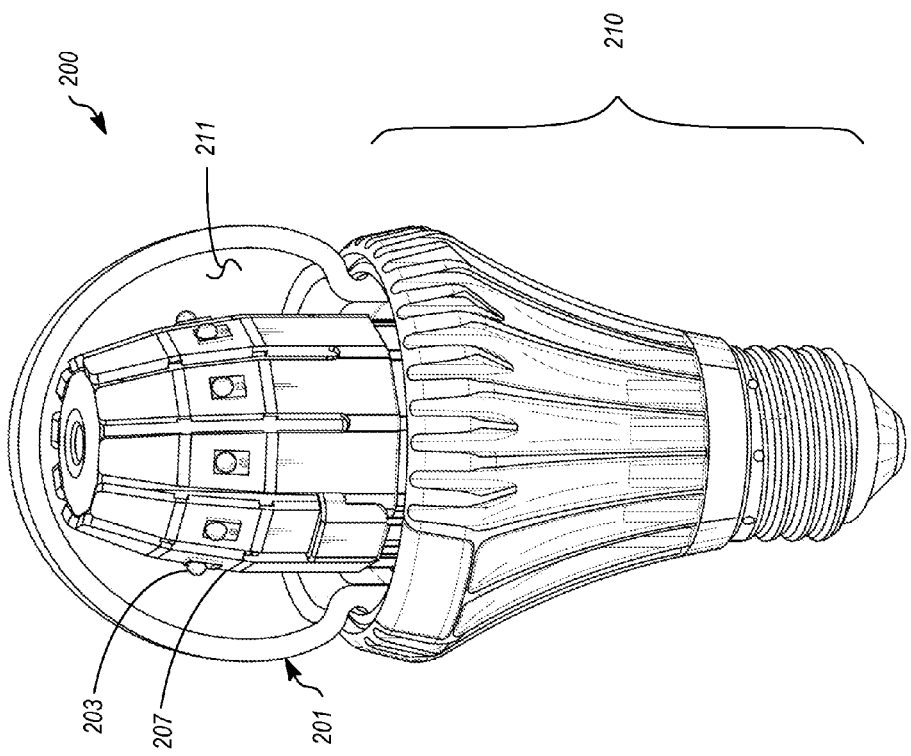
FIG. 5 depicts an LED bulb.

FIG. 5 depicts another embodiment of an LED bulb 200. As shown in FIG. 5, LED bulb 200 includes a base 210 and a shell 201 encasing the various components of LED bulb 200. The shell 201 is attached to the base 210 forming an enclosed volume. An array of LEDs 203 are mounted to LED mounts 207 and are disposed within the enclosed volume. The enclosed volume is filled with a thermally conductive liquid 211. LED bulb 200 also includes a receptacle that allows for the thermal expansion of the thermally conductive liquid 211. FIGS. 3A, 6B, 7A, 7B, 8A, and 8B depict various receptacles that can be used in the LED bulb 200. One of skill in the art would also recognize that the exemplary receptacles (e.g., bladders) depicted in FIGS. 2A, 2B, 3, and 4 may also be implemented with LED bulb 200 and that the exemplary receptacles (e.g., bladders) depicted in FIGS. 3A, 6B, 7A, 7B, 8A, and 8B may also be implemented with LED bulb 100.

In the embodiment of FIGS. 6A, 6B, 7A, 7B, 8A, and 8B, the receptacle is a bladder (620, 720, 820) filled with a compressible medium and immersed in the thermally conductive liquid of the LED bulb. In the following embodiments, the compressible medium is a gas. However, other compressible mediums could also be used (e.g., foam, compressible gel). Typically, the compressibility of the compressible medium is due to the presence of a trapped gas.

FIGS. 6A and 6B depict a bladder 620 (exemplary receptacle) having an approximately rectangular profile. FIG. 6B depicts the bladder 620 alone, and FIG. 6A depicts the bladder 620 installed in a cavity 630 of an LED bulb 200. The rectangular profile of the bladder 620 allows the bladder 620 to fill a rectangular-profile cavity 630. In this case, the rectangular-profile cavity 630 is a cylindrical volume. In some cases, the bladder 620 almost completely fills the cavity 630 when the bladder 620 is in a fully expanded condition.

If the bladder 620 is shaped to fill the space in the cavity 630, the total volume of the bladder 620 may be maximized, which may be advantageous for a number of reasons. First, because the bladder 620 nearly fills the entire cavity 630, there is little or no wasted space within the cavity 630. Second, a bladder with a larger total volume may experience reduced deformation over a given expansion volume $V_e$ as compared to a bladder with smaller total volume. Reduced deformation may reduce the amount of bending that occurs in bladder material between expanded and compressed conditions, which may result in less material fatigue and improve the life of the bladder 620.

The bladder 620 is made from a substantially gas-impermeable material and filled with a compressible gas. In the present embodiment, the bladder 620 is made from a film laminate having a leak rate of approximately $5 \times 10^{-7}$ cc/sec. The gas-impermeable nature of the bladder 620 reduces the amount of gas that is released into the thermally conductive liquid and prevents the formation of bubbles within the LED bulb. The bladder 620 must also be able to withstand repeated deformation and the maximum temperature of the thermally conductive liquid. As discussed above, the maximum temperature of the thermally conductive liquid can be 120° C. when the LED bulb is in operation.

In some cases, the bladder 620 is made from a film laminate that includes more than one film layer. A first, external layer is made from polyethylene terephthalate (PET) that is approximately 12 microns thick. A second layer is a polymer film that acts as a gas barrier. The second layer may be sputtered or coated with an aluminum oxide or silicon oxide to improve gas-barrier properties. The multiple layers may be laminated using an adhesive or other laminating technique.

In some cases, the film laminate includes a third layer. The third layer, which forms the inside of the bladder 620, is made from a heat sealable material allowing the walls of the bladder 620 to be bonded using a heat-sealing technique. For example, the third layer may be made from a cast polypropylene approximately 50 microns thick. In other embodiments, the bladder 620 may be made from other materials including a metal foil material, a metal-coated material, or an elastic material. The bladder may also be made from an elastic material allowing the bladder to expand as well as compress.

FIGS. 7A and 7B depict a bladder 720 having an alternative profile shape. FIG. 7B depicts the bladder 720 alone, and FIG. 7A depicts the bladder 720 installed in a cavity 730 of an LED bulb 200. The shape of the bladder 720 allows the bladder 720 to collapse in a predetermined manner when changing between first and second conditions. Specifically, bladder 720 includes a detent portion 722 and taper portions 724 that allow the walls of the bladder to buckle without folding or creasing the bladder material beyond a minimum flex radius. In some cases, the detent portion 722 has a minimum flex radius of at least 1 mm. By preventing the bladder material from exceeding a minimum flex radius during compression, the bending stress of the bladder wall can be held below an acceptable limit. In some cases, this may improve the fatigue life of the material and improve the reliability of the bladder 720.

FIG. 8A depicts another LED bulb 200 having multiple bladders 820. As discussed above with respect to FIG. 3, multiple bladders can be used to compensate for expansion of the thermally conductive liquid. FIG. 8B depicts a single bladder 820 of the multiple bladders. FIG. 8A depicts multiple bladders 820 installed in a cavity 830 of an LED bulb 200. As shown in FIG. 8A, the bladders 820 are stacked along a central axis, which allows them to be placed in a rectangular-profile (e.g., cylindrical) cavity 830. In some cases, the exterior walls of adjacent bladders 820 may be bonded to one another to help maintain overall shape of the stack.

Each bladder 820 is capable of providing at least a portion of the expansion volume $V_e$. In the example shown in FIG. 8A, each of the seven bladders 820 provides approximately one-seventh of the total expansion volume $V_e$. Because each bladder 820 provides a fraction of the $V_e$, each chamber may experience a reduced amount of deformation (as compared to a single-chamber bladder). As described above, reduced deformation may reduce the amount of bending that occurs in bladder material between expanded and compressed conditions, which may result in less material fatigue and improve the life of the bladder 820. Note that the multiple bladders 420 depicted in FIG. 4 may benefit from similar advantages.

The multiple bladder embodiment of FIG. 8A may fill the cylindrical space available in the cavity 830 of the LED bulb 200, which maximizes total combined volume of the bladders 820 and may also reduce the amount of deformation in the bladder material for a given expansion volume $V_e$. Another potential advantage of the multiple bladder embodiment is that each bladder 820 may be able to expand and compress without folding or creasing the material beyond a minimum flex radius. As discussed above, maintaining a minimum flex radius during bladder compression may increase the life of the bladder 820.

In another exemplary embodiment, a bladder may be formed having multiple chambers, each chamber filled with a compressible medium, such as a gas. The chambers may be formed from one or more webs of material connected to the walls of the bladder to form an enclosed volume. Each chamber is able to expand and compress to compensate for expansion of the thermally conductive liquid.

Although a feature may appear to be described in connection with a particular embodiment, one skilled in the art would recognize that various features of the described embodiments may be combined. Moreover, aspects described in connection with an embodiment may stand alone.

We claim:

1. A liquid-filled light emitting diode (LED) bulb comprising:
    a base;
    a shell connected to the base;
    a thermally conductive liquid held within the shell;
    two or more LEDs disposed within the shell and immersed in the thermally conductive liquid;
    a cavity central to the two or more LEDs; and
    a bladder immersed in the thermally conductive liquid, wherein the bladder is configured to compensate for expansion of the thermally conductive liquid, and wherein the bladder is disposed within the cavity.

2. The liquid-filled LED bulb of claim 1,
    wherein the bladder is configured to change from a first condition to a second condition in response to thermal expansion of the thermally conductive liquid;
    wherein a first volume is provided for the thermally conductive liquid when the bladder is in the first condition; and wherein a second volume, which is greater than the first volume, is provided for the thermally conductive liquid when the bladder is in the second condition.

3. The liquid-filled LED bulb of claim 2, wherein the difference between the first and second volume is at least 7 milliliters.

4. The liquid-filled LED bulb of claim 2, wherein the first volume is between 15 and 90 milliliters.

5. The liquid-filled LED bulb of claim 2, wherein the bladder is configured to have a minimum radius of at least 1 millimeter along any interior surface when the bladder is in the second condition.

6. The liquid-filled LED bulb of claim 1, further comprising:
two or more LED mounts configured to hold the two or more LEDs.

7. The liquid-filled LED bulb of claim 1, further comprising:
three or more LED mounts configured to hold three or more LEDs in a radial pattern, wherein the cavity is central to the three or more LEDs.

8. The liquid-filled LED bulb of claim 7, wherein the bladder is configured to change from a first condition to a second condition in response to thermal expansion of the thermally conductive liquid, and wherein the bladder is configured to substantially fill the cavity portion when the bladder is in the first condition.

9. The liquid-filled LED bulb of claim 1, wherein the bladder is made from a sleeve of material that is sealed at both ends and filled with a gas.

10. The liquid-filled LED bulb of claim 1, wherein the bladder is made from a laminate material that includes at least two film layers.

11. The liquid-filled LED bulb of claim 10, wherein a first layer of the at least two film layers is a polyethylene terephthalate (PET) film, and wherein a second layer of the at least two film layers is a polymer film configured to act as a gas barrier.

12. The liquid-filled LED bulb of claim 11, wherein a third layer of the at least two film layers is a heat sealable film material.

13. The liquid-filled LED bulb of claim 1, wherein the bladder is attached to the base.

14. The liquid-filled LED bulb of claim 1, wherein the thermally conductive liquid has a rate of thermal expansion between $1.4 \times 10^{-3}$ degrees $C^{-1}$ and $7.0 \times 10^{-4}$ degrees $C^{-1}$.

15. The liquid-filled LED bulb of claim 1, wherein the thermally conductive liquid is configured to spread the heat from the two or more LEDs to the shell via passive convective flow.

16. The liquid-filled LED bulb of claim 1, wherein the base is configured to spread the heat from the two or more LEDs via a conductive path from the two or more LEDs.

17. The liquid-filled LED bulb of claim 1, wherein the bladder comprises two or more bladders immersed in the thermally conductive liquid, wherein each of the two or more bladders is configured to compensate for a portion of the expansion of the thermally conductive liquid.

18. The liquid-filled LED bulb of claim 1, wherein the bladder is a single bladder and the single bladder includes two or more chambers, each chamber forming an enclosed volume, each chamber being filled with a gas, and each chamber being configured to compensate for a portion of the expansion of the thermally conductive liquid.

19. The liquid-filled LED bulb of claim 1, wherein the two or more LEDs are positioned toward the vertical middle of the shell, when the LED bulb is in a vertical orientation.

20. The liquid-filled LED bulb of claim 1, further comprising a connector base for connecting the LED bulb to a lighting fixture.

21. The liquid-filled LED bulb of claim 1, wherein the connector base includes threads for inserting the LED bulb into the lighting fixture.

22. A liquid-filled light emitting diode (LED) bulb comprising:
a base;
a shell connected to the base;
two or more LEDs disposed within the shell;
a thermally conductive liquid held within the shell, wherein at least a portion of the thermally conductive liquid is disposed between the two or more LEDs and the shell;
a cavity central to the two or more LEDs; and
a bladder immersed in the thermally conductive liquid, wherein the bladder is configured to compensate for expansion of the thermally conductive liquid, and wherein the bladder is disposed within the cavity.

23. The liquid-filled LED bulb of claim 22, wherein the two or more LEDs are positioned toward the vertical middle of the shell, when the LED bulb is in a vertical orientation.

24. The liquid-filled LED bulb of claim 22, further comprising a connector base for connecting the LED bulb to a lighting fixture.

25. The liquid-filled LED bulb of claim 24, wherein the connector base includes threads for inserting the LED bulb into the lighting fixture.

26. The liquid-filled LED bulb of claim 22,
wherein the bladder is configured to change from a first condition to a second condition in response to thermal expansion of the thermally conductive liquid;
wherein a first volume is provided for the thermally conductive liquid when the bladder is in the first condition; and
wherein a second volume, which is greater than the first volume, is provided for the thermally conductive liquid when the bladder is in the second condition.

27. The liquid-filled LED bulb of claim 26, wherein the bladder is configured to have a minimum radius of at least 1 millimeter along any interior surface when the bladder is in the second condition.

28. A method of making a liquid-filled light emitting diode (LED) bulb comprising:
obtaining a base;
connecting two or more LEDs to the base;
connecting a shell to the base, wherein the two or more LEDs are disposed within the shell, wherein there is a cavity central to the two or more LEDs, wherein a bladder was placed within the shell, wherein the bladder is configured to compensate for expansion of a thermally conductive liquid, and wherein the bladder is disposed within the cavity; and
filling the shell with the thermally conductive liquid, wherein the two or more LEDs and the bladder are immersed in the thermally conductive liquid.

* * * * *